United States Patent [19]
Irrinki et al.

[11] Patent Number: 5,987,632
[45] Date of Patent: Nov. 16, 1999

[54] METHOD OF TESTING MEMORY OPERATIONS EMPLOYING SELF-REPAIR CIRCUITRY AND PERMANENTLY DISABLING MEMORY LOCATIONS

[75] Inventors: V. Swamy Irrinki, Milpitas; Thomas R. Wik, Livermore, both of Calif.

[73] Assignee: LSI Logic Corporation, Milpitas, Calif.

[21] Appl. No.: 08/852,692

[22] Filed: May 7, 1997

[51] Int. Cl.$^6$ .............................. G11C 29/00; G11C 7/00; G06F 11/00
[52] U.S. Cl. ................................. 714/711; 714/7; 365/201
[58] Field of Search .................................. 371/10.2, 10.3, 371/21.4; 395/182.05; 365/200, 201; 714/710, 711, 721, 7

[56] References Cited

U.S. PATENT DOCUMENTS

| | | | |
|---|---|---|---|
| 4,543,594 | 9/1985 | Mohsen et al. | 357/51 |
| 5,577,050 | 11/1996 | Bair et al. . | |
| 5,668,818 | 9/1997 | Bennett et al. | 371/22.31 |
| 5,764,878 | 6/1998 | Kablanian et al. | 395/182.05 |
| 5,841,709 | 11/1998 | McClure | 365/200 |

Primary Examiner—Robert W. Beausoliel, Jr.
Assistant Examiner—Brian H. Shaw
Attorney, Agent, or Firm—Conley, Rose & Tayon, PC; B. Noel Kivlin

[57] ABSTRACT

A test method for a memory device wherein failures that may only occur under specified worst-case conditions are converted to hard functional failures. These locations are subsequently detected and remapped by built-in self test (BIST) and built-in self-repair (BISR) circuitry. First, a test suite is performed on a memory array which includes redundant row and column locations. Typically, this test suite is performed under conditions which are most likely to induce failure. Row and column locations that are determined to be malfunctioning are scanned out of the memory device, along with the number of available redundant rows and columns. If there are sufficient redundant locations, the failing rows and columns are permanently disabled by blowing each of the corresponding fuse links. When power is subsequently applied to the memory device, BIST will detect rows and columns, including those permanently disabled, with hard functional failures. Accesses to these locations may then be redirected by BISR circuitry. The test suite may then be re-executed, and the device deemed defective if additional errors are found. Rows and columns in the memory array that are prone to failure are thus never enabled. Additionally, the BIST and BISR circuitry provides the ability to verify basic memory functionality and remap failing addresses on each application of power to the device. Test coverage of the memory array is advantageously increased.

19 Claims, 5 Drawing Sheets

METHOD OF TESTING MEMORY OPERATIONS EMPLOYING SELF-REPAIR CIRCUITRY AND PERMANENTLY DISABLING MEMORY LOCATIONS

BACKGROUND OF THE INVENTION

1. Field of the Invention

This invention relates to the field of digital electronic memory devices, and in particular to a method for testing these devices during the manufacturing process.

2. Description of the Related Art

It is common practice for the manufacturers of memory chips to test the functionality of the memories at the manufacturing site. After the chips have been tested and certified for shipment upon sale to the users, the users generally depend upon the reliability of the chips for their own system to function properly. As the density and line width of memory cells within a memory array circuit chip continue to shrink (now at less than half a micron), this reliability becomes more difficult to achieve. One of the challenges for the manufacturers of memory devices, then, is to increase memory capacity without decreasing chip yields due to malfunctioning parts.

Before the memory chips are released for shipment, they typically undergo testing to verify that each of the memory cells within the memory array is functioning properly. This testing method is routinely done because it is not uncommon for a large percentage of the memory cells within the chip to fail, either because of manufacturing defects or degradation faults.

In the past, chip memories have been tested using an external memory tester or Automatic Test Equipment (ATE) at the manufacturing site. This testing technique is not available to users once the chips have been shipped, making it difficult to detect faulty memory cells at the user site. Even if test equipment is available to users, field repairs are expensive, time-consuming, and impractical.

Because of the complexity of field repairs, some memory chips have been equipped with built-in self test (BIST) and built-in self repair (BISR) circuitry. As used herein, the term "BIST" refers to the actual test, while "BIST unit" and "BIST circuitry" refer to the circuitry that performs BIST. Similarly, "BISR" refers to the process of built-in self repair, while "BISR unit" and "BIST circuitry" refer to the circuitry that performs BISR. BIST operates by reading and writing various patterns to the memory at chip power-up, thus determining faulty memory cells. If failing cells are present, the BISR circuitry reassigns the row or column containing the failing cell to a spare row or column in the memory array. The chip is therefore able to function even if all cells are not operational. Because BIST and BISR are performed each time power is applied to the system, latent failures that occur between subsequent system power-ups may be detected in the field.

Since BIST and BISR are conducted at the operating conditions that exist at the time the system containing the memory device is powered on, they may not identify memory cells that are susceptible to failure at degraded conditions. For example, the refresh interval of a dynamic memory cell is a strong function of temperature, such that the necessary refresh interval of the cell decreases as the temperature increases. While BIST and BISR may perform a refresh interval test at power-up, the temperature of the system at that time may not be sufficient to induce a failure. Subsequently, however, the temperature of the system may increase to a point that one or more memory cells will fail. Since BIST and BISR have already been performed at system power-on, BISR does not redirect accesses to these cells, which may result in a catastrophic system error.

It would therefore be desirable to have a test method which identifies and disables memory locations that are susceptible to failure under degraded conditions, while still maintaining the ability to detect and repair failures dynamically at the customer site.

SUMMARY OF THE INVENTION

The problems outlined above are in large part solved by a test method in accordance with the present invention. In one embodiment, a test method for a memory device is provided wherein failures that may only occur under specified worst-case conditions are converted to hard functional failures. These locations are subsequently detected and remapped by built-in self test (BIST) and built-in self-repair (BISR) circuitry. First, a test suite is performed on a memory array which includes redundant row and column locations. Typically, this test suite is performed under conditions which are most likely to induce failure. Row and column locations that are determined to be malfunctioning are scanned out of the memory device, along with the number of available redundant rows and columns. If there are sufficient redundant locations, the failing rows and columns are permanently disabled by blowing each of the corresponding fuse links. When power is subsequently applied to the memory device, BIST will detect rows and columns, including those permanently disabled, with hard functional failures. Accesses to these locations may then be redirected by BISR circuitry. The test suite may then be re-executed, and the device deemed defective if additional errors are found.

Rows and columns in the memory array that are prone to failure are thus never enabled. Additionally, the BIST and BISR circuitry provides the ability to verify basic memory functionality and remap failing addresses on each application of power to the device. Test coverage of the memory array is advantageously increased.

Broadly speaking, the present invention contemplates a method of testing a memory device including a memory array which further includes a plurality of rows. The method comprises performing a given test on the plurality of rows under a particular set of operating conditions, and determining that a particular row within the plurality of rows is malfunctioning in response to results from the given test. The method further comprises permanently disabling memory accesses to the particular row. Additionally, the method comprises performing a self-test operation upon the memory array in response to an application of power to the memory device during normal operating conditions, with the self-test operation identifying any malfunctioning rows within the memory array including the particular row. Finally, the method comprises enabling a redundant row for each of the malfunctioning rows.

The present invention further contemplates a method of testing a memory device including a memory array which further includes a plurality of columns. The method comprises performing a given test on the plurality of columns under a particular set of operating conditions, and determining that a particular column within the plurality of columns is malfunctioning in response to results from the given test. The method further comprises permanently disabling memory accesses to the particular column. Additionally, the method comprises performing a self-test operation upon the memory array in response to an application of power to the memory device during normal operating conditions, with the self-test operation identifying any malfunctioning columns within the memory array including the particular column. Finally, the method comprises enabling a redundant column for each of the malfunctioning columns.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
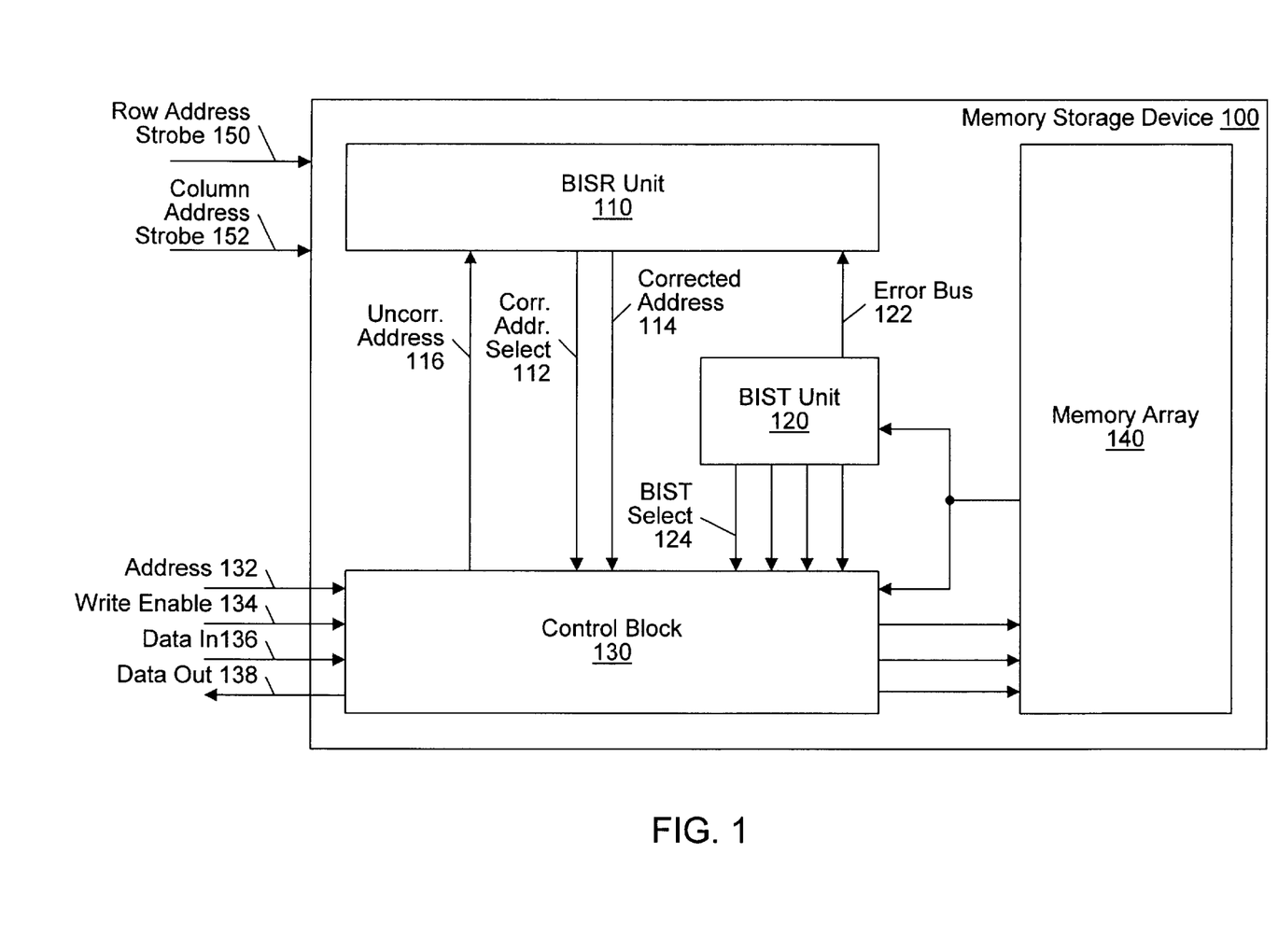
FIG. 1 depicts a block diagram of one embodiment of a memory storage device.

Turning now to FIG. 1, a block diagram of one embodiment of a memory storage device 100 is shown. As depicted, memory storage device 100 includes a built-in self repair (BISR) unit 110 coupled to a built-in self test (BIST) unit 120 and a control block 130. Control block 130 receives various inputs to memory storage device 100: address 132, write enable 134, and data in signal 136. Row address strobe 150 and column address strobe 152 are also inputs to memory storage device 100, but their internal connections are not shown in FIG. 1 for simplicity. Control block 130 also conveys data out signal 138 as an output of memory storage device 100. BISR unit 110 is coupled to control block 130 by corrected address select 112, corrected address 114, and uncorrected address 116, and to BIST unit 120 by error bus 122. BIST unit 120 is coupled to control block 130 by several signals, including BIST select 124. Memory array 140 receives various inputs from control block 130, and conveys output to both BIST unit 120 and control block 130.

Generally speaking, BIST and BISR can be employed in a memory storage device 100 to provide improved test coverage for faulty memory cells. In one embodiment, BIST unit 120 cycles memory array 140 through various test patterns upon power-up. Every time a failing row or column is detected, this information is conveyed to BISR unit 110, which attempts to reassign accesses to the failing location to a redundant row or column within the array. BISR unit 110 monitors all incoming addresses (conveyed on uncorrected address 116) to determine if any match one of the failing address detected by BIST. If a match is found, BISR unit 110 conveys the corrected address 114 to control block 130 so that the reassigned row or column is accessed instead of the location originally addressed. This combination of BIST and BISR testing each cell in the memory array and redirecting addresses is performed on each application of power to the memory chip.

As described above, BIST and BISR only detect memory locations that are failing at power-up, and not those that may occur after a given time (e.g., temperature-related fails that may occur after the system heats up). These locations may be detected and permanently disabled during manufacturing testing, however. In one embodiment, failing rows or columns are disabled by blowing a fuse link implemented in a control line attached to the memory cell. BIST and BISR will then be able to identify these memory locations in the field, since they are now permanent functional failures. Accesses to these addresses will be redirected by BISR unit 110 to functioning locations.

To access memory array 140 within memory storage device 100, a row address is driven upon address 132 in conjunction with row address strobe signal 150, selecting a particular row within memory array 140. For a write operation, write enable 134 is also asserted, with the data to be written driven on data in signal 136. For a read operation, write enable 134 is de-asserted, with no data being driven on data in signal 136. Next a column address is driven on address 132 in conjunction with column address strobe signal 152, selecting a particular column within memory array 140. For a write operation, the value on data in signal 136 is written to the memory cell at the intersection of the selected row and column within memory array 140. For a read operation, the value of the memory cell at the intersecting row and column is conveyed on data out signal 138.

BIST unit 120 can also drive inputs to memory array 140 through control block 130. As will be described below, BIST unit 120 reads and writes patterns to memory array 140 in order to test the cells therein for various types of faults. The address and control signals are selected over those conveyed on the external pin by means of BIST select signal 124. When BIST unit 120 detects an error, the failure information is conveyed to BISR unit 110 upon error bus 122. BISR unit 110 stores the failing address and redirects accesses to these locations to a redundant row or column within memory array 140. BISR monitors incoming uncorrected address 116 in order to check for accesses to addresses that need to be remapped. If such a condition is detected, the corrected address is conveyed on corrected address 114, with selection control provided by corrected address select signal 112.

Figure 2:
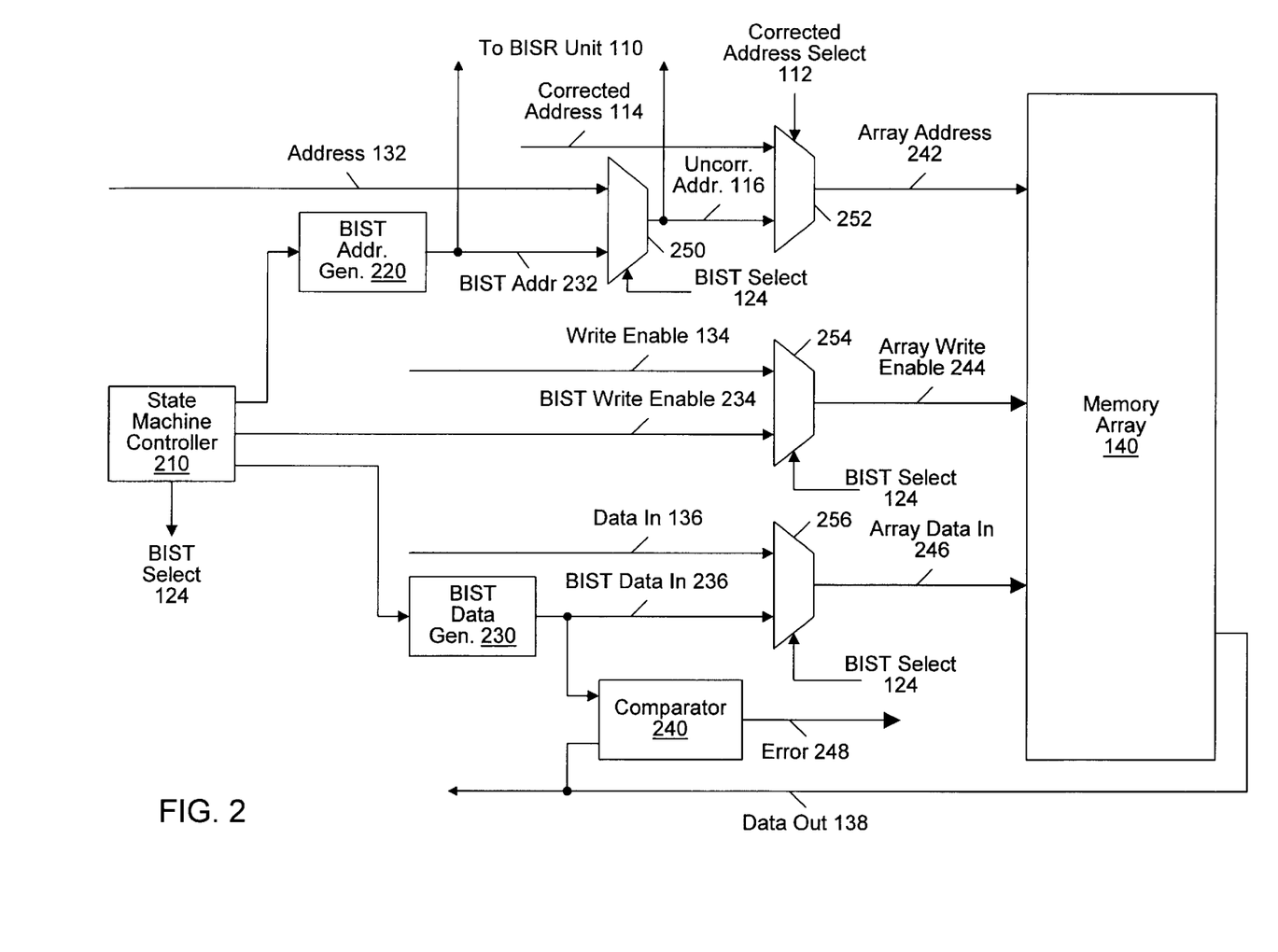
FIG. 2 depicts a block diagram of one embodiment of built-in self test and control circuitry within a memory storage device.

Turning now to FIG. 2, a block diagram of portions of memory storage device 100 depicted in FIG. 1 is shown in greater detail. Circuit portions corresponding to those of FIG. 1 are numbered identically.

Portions of BIST unit 120 depicted in FIG. 2 include a state machine controller 210, a BIST address generator 220, a BIST data generator 230, and a comparator 240. State machine controller 210 drives a BIST write enable signal 234, as well as inputs to BIST address generator 220 and BIST data generator 230. BIST address generator 220 drives a BIST address 232, while BIST data generator 230 drives a BIST data in signal 236. A BIST data in signal 236 is also an input to comparator 240, which also receives data out signal 138 from memory array 140. The output of comparator 240, an error signal 248, is conveyed to BISR unit 110 as part of error bus 122, along with BIST address 232. BIST address 232, BIST write enable 234, and BIST data in signal 236 are driven to control block 130 along with multiplexer control signal BIST select 124.

Portions of control block 130 depicted in FIG. 2 include an address multiplexer 250, a corrected address multiplexer 252, a write enable multiplexer 254, and a data in multiplexer 256. Address multiplexer 250 selects between address 132 from the external pins and BIST address 232 (based on BIST select 124), and conveys an uncorrected address 116 to corrected address multiplexer 252 and BISR unit 110. Multiplexer 252 also receives corrected address 114 from BISR unit 110, along with corrected address select 112 as the control signal. The output of corrected address multiplexer 252 is array address 242, which is presented to memory array 140. Write enable multiplexer 254 selects between write enable 134 from the external pins and BIST write enable 234 (based on BIST select 124), and conveys array write enable 244 to memory array 140. Similarly, data in multiplexer 256 selects between data in signal 136 from the external pins and BIST data in signal 236 (based on BIST select 124), and conveys array data in bus 246 to memory array 246.

When power is applied to memory storage device 100, BIST unit 120 begins a test algorithm to verify the operation of memory array 140. Typical test patterns may check memory array 140 for stuck-at, bridging, and data retention faults. Stuck-at faults indicate a particular cell is "stuck" at a certain value, while a bridging fault indicates a cell is shorted to an adjoining cell. Data retention faults indicate the cell has failed the refresh interval specification.

In one embodiment of memory storage device 100, BIST unit 110 is simply a state machine that is programmed to cycle through various test patterns. BIST address generator 220 generates addresses in an order specified by the test algorithm. In one embodiment, address generator 220 may simply be a counter circuit that is initialized to point to the first address in memory array 140, and subsequently cycles through all available address locations in response to appropriate input signals from state machine controller 210. Additionally, state machine controller 210 drives BIST write enable signal 234 to select either a read or write operation to memory array 140 as defined by the test algorithm. BIST data generator 230 generates a data value on BIST data in signal 236 in response to additional control signals from state machine controller 210. This value is conveyed to memory array 140 on array data in signal 246 during a write cycle. On a read cycle, this value is conveyed on BIST data in signal 236 to comparator 240, which also receives the output of memory array 140 on data out signal 138. Comparator 240 then compares the values on BIST data in signal 236 and data out signal 138, asserting error signal 248 if a mismatch is detected. This signal and BIST address 232, which indicates the failing address, are conveyed to BISR unit 110 as error bus 122.

After BIST unit 120 has completed testing, state machine controller 210 becomes inactive, no longer asserting BIST select 124. At this point, memory storage device 100 can now satisfy requests for memory array 140 from the external pins. Since BIST select 124 is inactive, address 132 will be selected at address multiplexer 250, write enable 134 will be selected at write enable multiplexer 254, and data in 136 will be selected at data in multiplexer 256. These signals will thus be conveyed to memory array 140 through their respective multiplexers.

Figure 3:
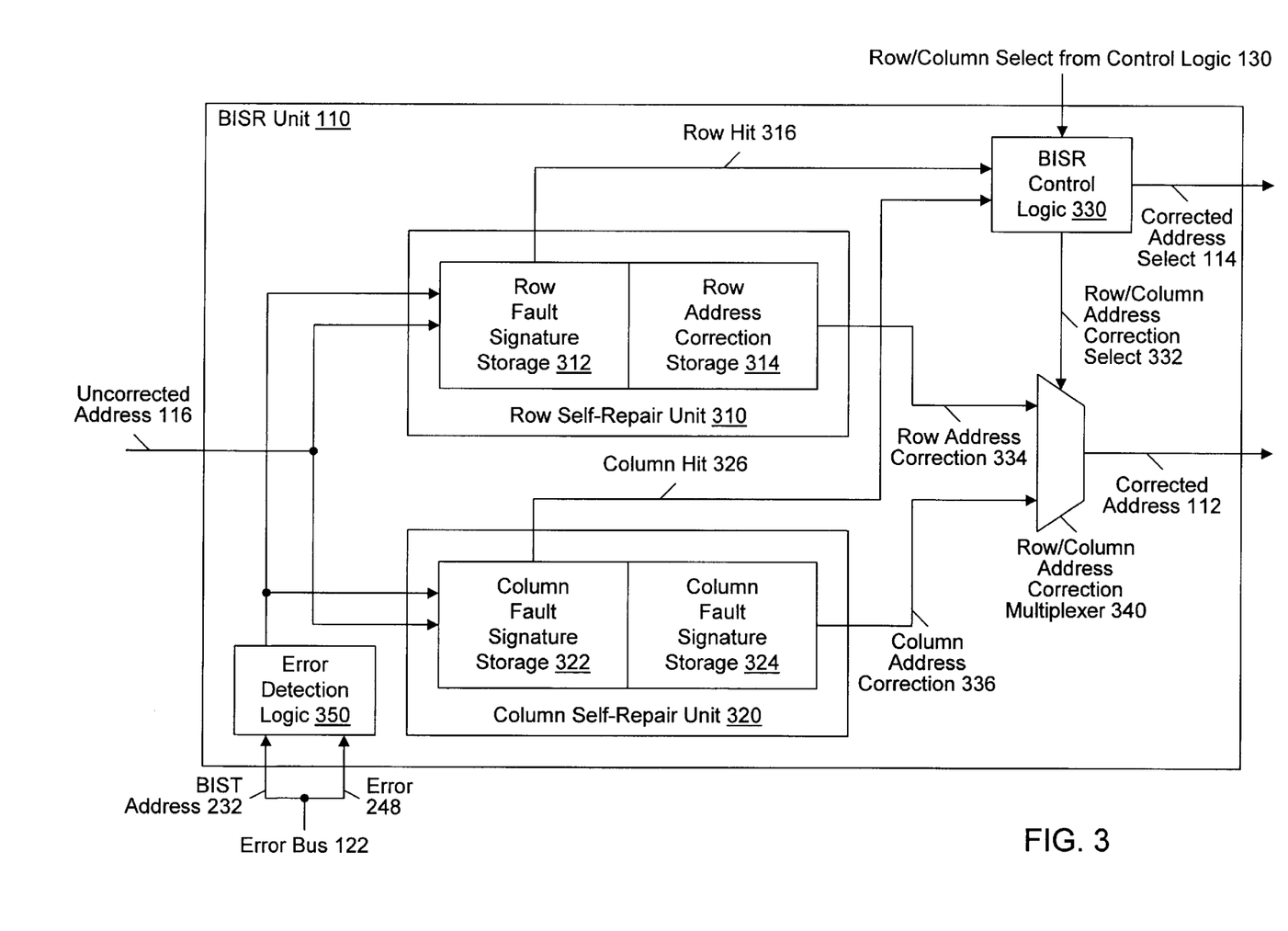
FIG. 3 depicts a block diagram of one embodiment of built-in self repair circuitry within a memory storage device.

Turning now to FIG. 3, a block diagram of one embodiment of BISR unit 110 is shown. Circuit portions corresponding to those of FIG. 1 are numbered identically.

As illustrated, BISR unit 110 comprises a row self-repair unit 310, a column self-repair unit 320, a BISR control logic block 330, a row/column address correction multiplexer 340, and an error detection logic block 350. Uncorrected address 116 is conveyed to both row self-repair unit 310 and column self-repair unit 320. Within row self-repair unit 310, uncorrected address 116 indexes into row fault signature storage 312, which conveys a row hit signal 316 to BISR control logic 330. Row self-repair unit 310 also includes row address correction storage 314, which includes a corresponding entry for each location in row fault signature storage 312. When selected by an input from error detection logic 350, one of these entries is conveyed on row address correction 334 to row/column address correction multiplexer 340. Similarly, within column self-repair unit 320, uncorrected address 116 indexes into a column fault signature storage 322, which conveys a column hit signal 326 to BISR control logic 330. Column self-repair unit 320 also includes column address correction storage 324, which includes a corresponding entry for each location in column fault signature storage 322. When selected by an input from error detection logic 350, one of these entries is conveyed on column address correction 336 to row/column address correction multiplexer 340. BISR control logic block 330 receives a row/column select signal from control block 130 along with row hit signal 316 and column hit signal 326, and conveys corrected address select 114 to control block 130, and row/column address correction select 332 to row/column address correction multiplexer 340. Row/column address correction multiplexer 340 selects between row address correction 334 and column address correction 336 based on row/column address correction select 332, and conveys corrected address 112. Error detection logic receives error bus 122, comprising error signal 248 and BIST address 232, and conveys an error address to row self-repair unit 310 and column self-repair unit 320.

As described above with reference to FIG. 2, BIST is performed at device power-up upon memory array 140. When an error is detected by comparator 240, error signal 248 is asserted and conveyed to error detection logic block 350, along with BIST address 232. When error signal 248 is valid, the corresponding BIST address 232 is conveyed to both row self-repair unit 310 and column self-repair unit 320. One of these units, depending on row/column select logic signals (not shown) conveyed from control block 130, will store the failing address. If the failing address is a row address, the storage location will be within row fault signature storage 312. Conversely, if the failing address is a column address, the storage location will be within column fault signature storage 322.

When a failing row address is detected and stored in row fault signature storage 312, a redundant row address (if available) is assigned to the failing location and stored in row address correction storage 314. Similarly, when a failing column address is detected and stored in column fault signature storage 322, a redundant column address (if available) is assigned to the failing location and stored in column address correction storage 324. In one embodiment, row self-repair unit 310 is active during a column test of memory array 140, with column self-repair unit 320 being active during a row test. This prevents a column fail from affecting the results of a row test, and vice-versa. In either case above, if a redundant location is not available, BISR will communicate with BIST to indicate that an address could not be reassigned. BIST will then indicate a fatal error indicating that memory storage device 100 is defective.

After BIST has completed, memory storage device 100 will commence normal operation. Requests to memory array 140 will be made on address 132, write enable 134, and data in signal 136, instead of the corresponding BIST-generated signals. In this case, address 132 will be selected by address multiplexer 250 and conveyed upon uncorrected address 116 to both the row self-repair unit 310 and column self-repair unit 320 within BISR unit 110. Which unit is selected depends upon whether the access is to a row or column address.

If the address is a row address, uncorrected address 116 will index into row fault signature storage 312. If a match is found, row hit signal 316 will be asserted to BISR control logic block 330. Column hit signal 326 will not be active as the access is not to a column address. Also, an entry in row address correction storage 314 corresponding to the match found in row fault signature storage 312 will be conveyed to row/column address correction multiplexer 340 upon row address correction 334. BISR control logic 330 will drive row/column address correction select 332 to multiplexer 340, thereby selecting row address correction 334 to be conveyed as corrected address 112. Additionally, BISR control logic 330 asserts corrected address select 114 in response to row hit signal 316 being active. As described above, corrected address select 114 is used by control logic 130 to select either corrected address 114 or uncorrected address 116 to be conveyed to memory array 140.

Similarly, if the address is a column address, uncorrected address 116 will index into column fault signature storage 322. If a match is found, column hit signal 326 will be asserted to BISR control logic block 330. Row hit signal 316 will not be active as the access is not to a row address. Also, an entry in column address correction storage 324 corresponding to the match found in column fault signature storage 322 will be conveyed to row/column address correction multiplexer 340 upon column address correction 336. BISR control logic 330 will drive row/column address correction select 332 to multiplexer 340, thereby selecting column address correction 334 to be conveyed as corrected address 112. Additionally, BISR control logic 330 asserts corrected address select 114 in response to column hit signal 316 being active. As described above, corrected address select 114 is used by control logic 130 to select either corrected address 112 or uncorrected address 116 to be conveyed to memory array 140.

As described above, BIST unit 120 and BISR unit 110 detect failing memory cells within memory array 140 at power-up time. Accesses to these addresses may then be rerouted to other locations, thereby allowing continued operation of memory storage device 100. If a particular row or column in memory array 140 fails subsequent to BIST being performed, however, it is not remapped by BISR unit 110. Therefore, BIST and BISR may not detect some types of memory failures, especially those that are likely to occur after a period of time or under degraded operating conditions. Accesses to a row or column susceptible to such failures may thus result in potential data loss. Although it is difficult and impractical to identify these marginal memory cells once a memory device has been shipped to a customer site, such cells may be detected more readily during the manufacturing process. Marginal memory rows and columns may be identified and permanently disabled such that subsequent iterations of BIST and BISR performed at the customer site may detect and remap accesses to these rows and columns. As will described below, these rows and columns may be disabled by blowing a fuse link attached to the failing row or column.

Figure 4:
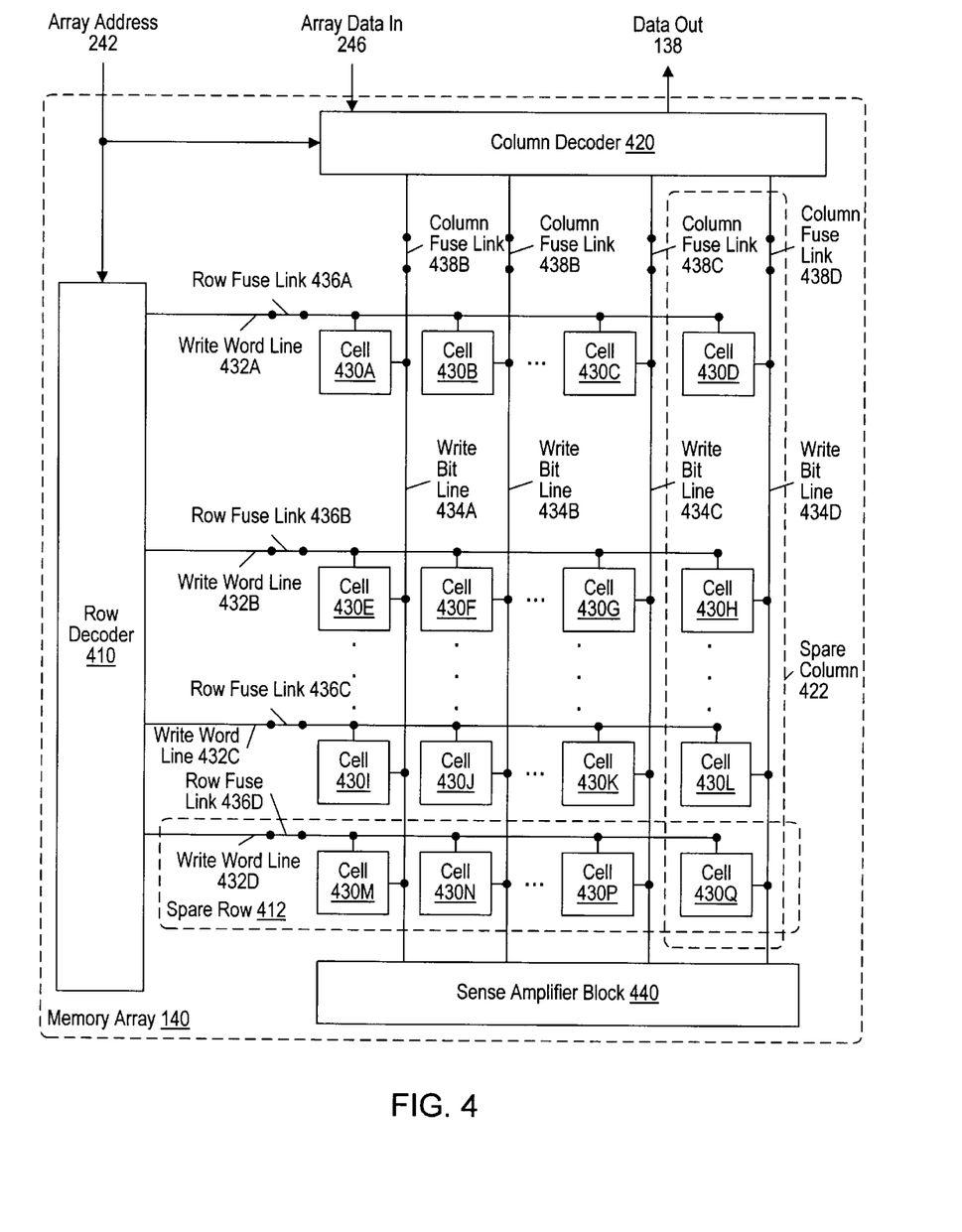
FIG. 4 depicts a block diagram of one embodiment of a memory array including row and column redundancy.

Turning now to FIG. 4, a block diagram of one embodiment of memory array 140 and its corresponding write circuitry is shown. Read circuitry within memory array 140 has been omitted for simplicity. Circuit portions corresponding to those of FIG. 1 are numbered identically.

As illustrated, memory array 140 includes a plurality of memory cells 430A–430Q (subsequently referred to as cells 430) coupled to a row decoder 410, a column decoder 420, and sense amplifier block 440. Cells 430 also include a spare row 412, comprising cells 430M, 430N, 430P, and 430Q. Additionally, cells 430 include a spare column 422, comprising cells 430D, 430H, 430L, and 430Q. Cells 430 are coupled to row decoder 410 by write word lines 432A–D, hereafter referred to as write word lines 432. Each write word line 432 includes a corresponding row fuse link 436A–D, hereafter referred to as row fuse links 436. Each of row fuse links 436 is configured such that blowing one of the fuse links isolates the row from row decoder 410, rendering the row unusable. Similarly, cells 430 are coupled to column decoder 420 and sense amplifier block 440 by write bit lines 434A–D, hereafter referred to as write bit lines 434. Each write bit line 434 includes a corresponding column fuse link 438A–D, hereafter referred to as column fuse links 438. Each of the column fuse links 438 is configured such that blowing one of the fuse links isolates the column from column decoder 420, rendering the column unusable. Row decoder 410 and column decoder 420 receive array address 242 from control block 130, along with other control signals not shown in FIG. 4 for simplicity. Column decoder 420 further receives input data on array data in bus 246, and conveys data out signal 138 as output.

To write a value to a particular cell in memory array 140, first a row address is conveyed on array address 242, along with an appropriate control signal indicating a row access. Row decoder 410 will assert a particular write word line 432, activating all cells on that row. Next, a column address is provided to column decoder 420 on array address 242, along with an appropriate control signal indicating a column access. Also, the desired data value to be written is conveyed on array data in signal 246. Column decoder 420 selects a particular write bit line 434 in response to the column address, and activates the corresponding sense amplifier in sense amplifier block 440 such that the desired data value is driven on the appropriate write bit line 434. Note that if the row fuse link 436 corresponding to the selected row or the column fuse link 438 corresponding to the selected column are blown, a subsequent write access to that location will fail. As will be described below, these fuse links may be blown to advantageously disable locations within memory array 140 that may have marginal operating characteristics.

It is noted that other embodiments of the fuse links depicted in memory array 140 are possible. For example, row and column fuse links may be implemented in the read word lines and read bit lines of the array to similar effect.

As described above, BIST unit 120 and BISR unit 110 perform a series of tests on memory array 140 to verify its correct operation. A typical test sequence may involve writing a logic low value to every cell 430 in array 140, followed by reading the value from every cell to determine if the write was successful. The same test may be performed using a logic high value. All rows and columns are typically tested in this manner, including redundant ones. If an error is found, the address of the failing location is reported to BISR unit 110. If the access is to a non-redundant row or column (in FIG. 4, the rows corresponding to write word lines 432A–C and the columns corresponding to write bit lines 434A–C) BISR unit 110 attempts to remap the failing location to a redundant row or column (in FIG. 4, spare row 412 or spare column 422). If a redundant row or column is found to be defective, it is not used for remapping. If a single cell is failing, either the row or column may be remapped. If multiple cells in a row are failing (possibly due to a bad write word line 432), the row is remapped; likewise, the column is remapped for multiple cells failing in a column. As long as redundant rows and columns are available, BISR unit 110 may continue remapping failing locations. If more failures are detected than can be remapped, BIST unit 110 indicates a fatal error.

BISR unit 110 stores failing row/column addresses along with the corresponding remapped addresses as described above. Subsequent accesses to failing addresses are detected by BISR, which monitors all memory requests via uncorrected address 116. BISR unit 110 then supplies corrected address 114 to control logic 130 along with corrected address select 112. In this manner, a failing address is replaced with a remapped address before it is presented to memory array 140.

Figure 5:
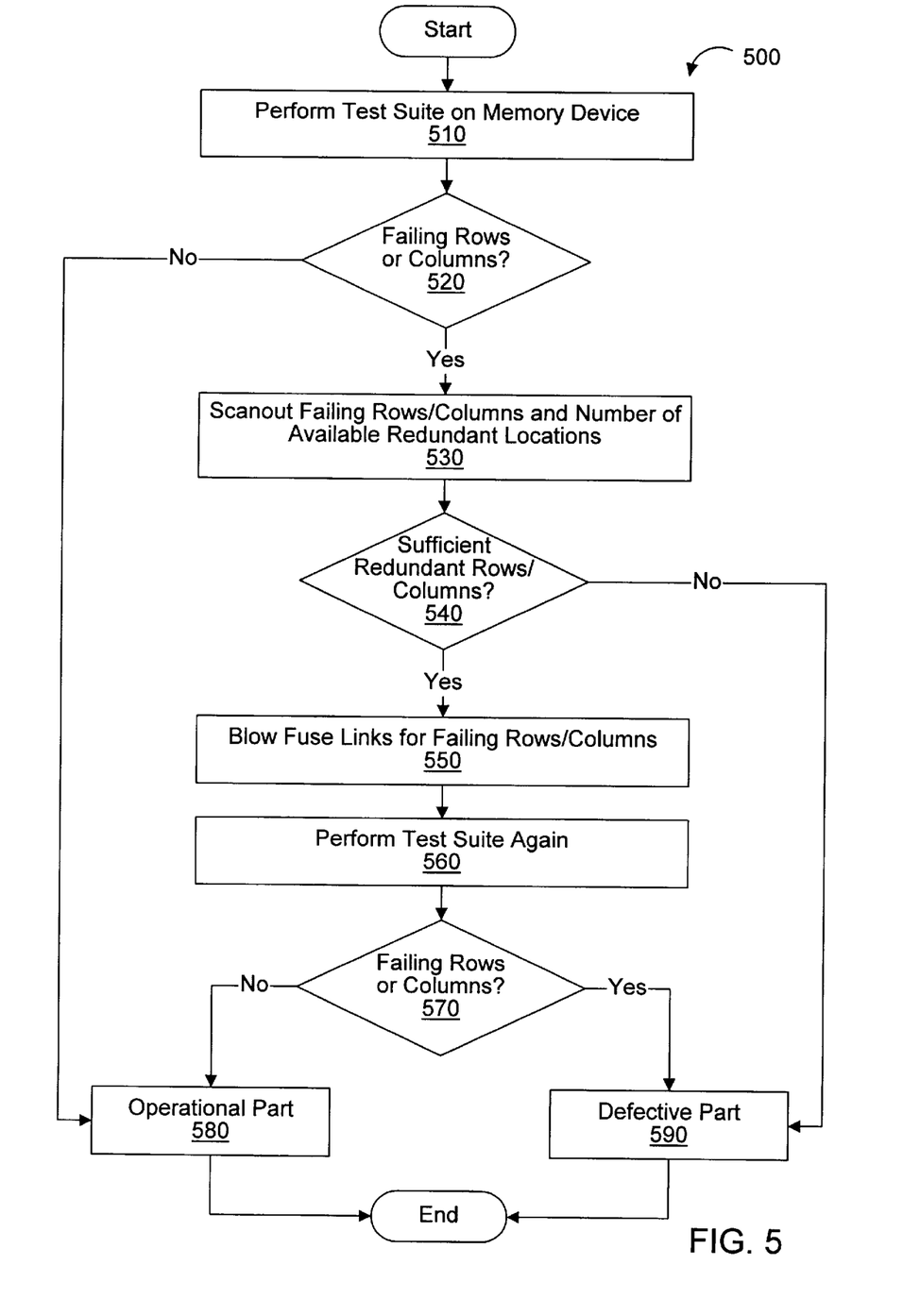
FIG. 5 depicts a flowchart of one embodiment of a method for testing a memory storage device.

Turning now to FIG. 5, a flowchart of a test method 500 for memory storage device 100 is shown. As depicted, method 500 begins by with a step 510, in which a particular test suite is performed on memory array 140 within memory storage device 100. Next, in a step 520, the results are processed, and a determination is made if there are any failing rows or columns. If no failing rows or columns are present, a step 580 is performed indicating memory storage device is operational. If failing rows and columns are present, these addresses are scanned out of memory storage device 100 in a step 530, along with the number of available redundant rows and columns in memory array 140. In a step 540, the number of available redundant rows and columns is compared with the number of failing rows and columns. If a sufficient number of rows or columns is not available, a step 590 is performed, indicating that the part is defective. If a sufficient number of rows and columns do exist, however, a step 550 is performed, in which the locations that failed the particular test suite performed in step 510 are disabled by blowing a fuse link associated with the row or column. This converts failures that may only exist under a particular set of operating conditions to a functional failure that can always be detected by BIST and BISR on power-up. The particular test suite is re-executed, using BISR, in a step 560. If a sufficient number of redundant rows and columns are left, the rows and columns disabled in step 550 are redirected to the redundant locations. Again, a determination of failing results is made in a step 570. If failing rows or columns (the disabled rows and columns should pass since they have been remapped) are present, step 590 is performed, with the part being considered defective. If no failing rows or columns are present, step 580 is performed, with the device being considered operational.

In one implementation, a test suite as described above is performed on memory storage device 100, after first conducting standard D.C. tests for continuity and leakage. The test suite begins with a gross functional test conducted at both a high and low supply voltage. This test involves various read and write patterns with only a loose timing constraint (that is, the basic functionality of the device is under test, not necessarily its speed). Any failures detected during this test are scanned out and recorded for later use. Next, an "at-speed" test is performed. This is similar to the gross functional test, only it is performed at the rated speed of the device. Again, any failing locations are scanned out and saved. Next a "voltage bump" test is conducted in which the device 100 is written at low voltage, read at high voltage, etc. Results from this test are likewise saved. Last, a refresh test is conducted in which each memory cell is checked to verify its data retention properties. Failing locations are scanned out as described above. These tests may be performed at a high temperature or voltage to simulate worst-case conditions.

Next, a post-processing routine is performed that compares the total number of failing rows and columns with the available number of spare rows and columns. If there are not a sufficient number of spare locations to handle the fails detected in test suite above, the device is deemed unusable. If there are enough spare rows and columns available, however, the failing and rows may be disabled by blowing the corresponding fuse link. The failing locations are supplied to a device which uses a laser beam to melt the desired fuse links. In one embodiment, the fuse links are implemented in the top metal layer of the integrated circuit containing the memory array.

Next, the test suite is re-executed under normal operating conditions. The locations that have been disabled should be identified and remapped by BISR unit 110. If failing locations are still found, the part is deemed defective. If all locations pass, however, the part is considered operational.

Numerous variations and modifications will become apparent to those skilled in the art once the above disclosure is fully appreciated. It is intended that the following claims be interpreted to embrace all such variations and modifications.

What is claimed is:

1. A method of testing a memory device, said memory device including a memory array including a plurality of rows, wherein said plurality of rows includes a plurality of standard rows and a plurality redundant rows, said method comprising:

performing a given test on said plurality of rows under a particular set of worst case operating conditions;

determining that a particular row within said plurality of rows is malfunctioning in response to results from said given test;

permanently disabling memory accesses to said particular row;

performing a self-test operation upon said memory array in response to an application of power to said memory device during normal operating conditions, wherein said self-test operation identifies any malfunctioning rows within said memory array including said permanently disabled particular row, and wherein said self-test operation is performed subsequently to said permanently disabling memory accesses to said particular row; and remapping each standard row of the malfunctioning rows to a corresponding redundant row, wherein said remapping enables memory accesses to each of said standard malfunctioning rows to be redirected to said corresponding redundant row.

2. The method of testing a memory device as recited in claim 1 wherein said memory device is fabricated upon an integrated circuit, and wherein said self-test operation is performed by a self-test circuit that is also implemented upon said integrated circuit.

3. The method of testing a memory device as recited in claim 2 wherein a self-repair circuit performs said remapping of each standard malfunctioning row.

4. The method of testing a memory device as recited in claim 3 wherein said self-repair circuit is also implemented upon said integrated circuit.

5. The method of testing a memory device as recited in claim 1 wherein said particular row includes a fuse link, and wherein blowing said fuse link disables said particular row.

6. The method of testing a memory device as recited in claim 5 wherein said fuse link is implemented in a top metal layer of said integrated circuit.

7. The method of testing a memory device as recited in claim 5 wherein said permanently disabling memory accesses to said particular row is performed by blowing said fuse link using a laser.

8. The method of testing a memory device as recited in claim 1 further comprising determining said memory device is unusable in response to a total number of said malfunctioning rows being greater than a total number of said redundant rows.

9. The method of testing a memory device as recited in claim 1 wherein said given test includes a refresh interval test of plurality of rows.

10. A method of testing a memory device, said memory device including a memory array including a plurality of columns, wherein said plurality of columns includes a plurality of standard columns and a plurality redundant columns, said method comprising:
performing a given test on said plurality of columns under a particular set of worst case operating conditions;
determining that a particular column within said plurality of columns is malfunctioning in response to results from said given test;
permanently disabling memory accesses to said particular column;
performing a self-test operation upon said memory array in response to an application of power to said memory device during normal operating conditions, wherein said self-test operation identifies any malfunctioning columns within said memory array including said permanently disabled particular column, and wherein said self-test operation is performed subsequently to said permanently disabling memory accesses to said particular column; and
remapping each standard column of the malfunctioning columns to a corresponding redundant column, wherein said remapping enables memory accesses to each of said standard malfunctioning columns to be redirected to said corresponding redundant column.

11. The method of testing a memory device as recited in claim 10 wherein said memory device is fabricated upon an integrated circuit, and wherein said self-test operation is performed by a self-test circuit that is also implemented upon said integrated circuit.

12. The method of testing a memory device as recited in claim 11 wherein a self-repair circuit performs said remapping of each standard malfunctioning column.

13. The method of testing a memory device as recited in claim 12 wherein said self-repair circuit is also implemented upon said integrated circuit.

14. The method of testing a memory device as recited in claim 10 wherein said particular column includes a fuse link, and wherein blowing said fuse link disables said particular column.

15. The method of testing a memory device as recited in claim 14 wherein said fuse link is implemented in a top metal layer of said integrated circuit.

16. The method of testing a memory device as recited in claim 14 wherein said permanently disabling memory accesses to said particular column is performed by blowing said fuse link using a laser.

17. The method of testing a memory device as recited in claim 10 comprising determining said memory device is unusable in response to a total number of said malfunctioning columns being greater than a total number of said redundant columns.

18. The method of testing a memory device as recited in claim 10 wherein said given test includes a refresh interval test of said plurality of columns.

19. A method of testing a memory device, wherein said memory device includes a memory array with a plurality of rows, wherein said plurality of rows includes a plurality of standard rows and a plurality of redundant rows, comprising:
applying a first test procedure on said plurality of rows under a first set of worst case conditions of operation for said memory array;
determining a first subset of said plurality of rows which fail said first test procedure;
permanently disabling said first subset of rows by blowing a fuse link in each of said first subset of rows using a laser beam;
performing a self-test operation on said memory array under normal operating conditions, after said permanently disabling said first subset of rows, and in response to power being applied to said memory device, wherein said self-test operation identifies a second subset of failing rows including said permanently disabled first subset of rows;
remapping each standard row in said second subset of rows to redundant rows not in said second subset of rows, wherein said remapping enables data accesses targeting any of said standard rows in said second subset to be redirected to a corresponding redundant row not in said second subset of rows;
reapplying said first test procedure on said plurality of rows in order to detect whether there exist failing standard rows after said remapping;
declaring said memory device to be unusable in response to an affirmative detection of one or more failing standard rows after said remapping;
declaring said memory device to be operational in response to a negative detection that none of said plurality of standard rows fail after said remapping.

* * * * *